United States Patent
Wang et al.

(10) Patent No.: US 7,139,171 B2
(45) Date of Patent: Nov. 21, 2006

(54) HEAT DISSIPATION DEVICE

(75) Inventors: Gen-Cai Wang, Shenzhen (CN);
Yi-Chyng Fang, Tu-Cheng (TW)

(73) Assignee: Hon Hai Precision Industry Co., Ltd., Taipei Hsien (TW)

(*) Notice: Subject to any disclaimer, the term of this patent is extended or adjusted under 35 U.S.C. 154(b) by 85 days.

(21) Appl. No.: 11/020,080

(22) Filed: Dec. 21, 2004

(65) Prior Publication Data

US 2005/0207118 A1   Sep. 22, 2005

(30) Foreign Application Priority Data

Mar. 18, 2004  (CN) ................. 2004 2 0043899

(51) Int. Cl.
*H05K 7/20* (2006.01)
(52) U.S. Cl. ............... 361/695; 361/697; 361/704; 165/80.3; 165/121; 257/722
(58) Field of Classification Search ........ 361/683–687, 361/690–697, 703, 704, 707, 714, 718, 722, 361/723, 724; 165/80.3, 104.33, 121–126, 165/185; 257/706, 707, 713, 718, 721–726; 174/16.3; 454/184; 415/177, 178, 213.1, 415/214.1
See application file for complete search history.

(56) References Cited

U.S. PATENT DOCUMENTS

| | | | | |
|---|---|---|---|---|
| 5,335,722 A | * | 8/1994 | Wu | 165/122 |
| 5,740,014 A | * | 4/1998 | Lin | 361/697 |
| 5,828,550 A | * | 10/1998 | Horng | 361/697 |
| 6,023,413 A | * | 2/2000 | Umezawa | 361/697 |
| 6,062,301 A | * | 5/2000 | Lu | 165/80.3 |
| 6,118,657 A | * | 9/2000 | Clemens | 361/697 |
| 6,199,624 B1 | | 3/2001 | Wotring | |
| 6,301,110 B1 | * | 10/2001 | Kodaira | 361/697 |
| 6,341,644 B1 | * | 1/2002 | Lo et al. | 165/80.3 |
| 6,415,852 B1 | * | 7/2002 | Lo | 165/80.3 |
| 6,418,020 B1 | | 7/2002 | Lin | |
| 6,449,151 B1 | * | 9/2002 | Chen | 361/697 |
| 6,460,609 B1 | | 10/2002 | Cho et al. | |
| 6,533,028 B1 | | 3/2003 | Sato | |
| 6,621,699 B1 | * | 9/2003 | Watanabe et al. | 361/697 |
| 7,004,236 B1 | * | 2/2006 | Lee et al. | 165/80.3 |
| 2002/0131236 A1 | * | 9/2002 | Lin | 361/709 |
| 2005/0183843 A1 | * | 8/2005 | Mochizuki et al. | 165/80.3 |

FOREIGN PATENT DOCUMENTS

| | | |
|---|---|---|
| CN | 00231566.1 | 7/2001 |
| CN | 00250809.5 | 7/2001 |
| TW | 496547 | 7/2002 |

* cited by examiner

*Primary Examiner*—Michael Datskovskiy
(74) *Attorney, Agent, or Firm*—Tim Tingkang Xia; Morris Manning Martin LLP

(57) ABSTRACT

A heat dissipation device includes a heat sink (50) and a fan (10) located above the heat sink for providing airflow. The heat sink includes a base (40) and a heat dissipating part (30) arranged on the base. The heat dissipating part includes a plurality of fins (31), each adjacent pair of the fins defines a channel (35) therebetween. The heat dissipating part defines a plurality of passages (34) disposed diagonally thereat and perpendicular to the channels. The channels and the passages are oriented consistently with the airflow of the fan.

17 Claims, 5 Drawing Sheets

HEAT DISSIPATION DEVICE

TECHNICAL FIELD

The present invention relates generally to a heat dissipation device, and more particularly to a heat dissipation device applied to electronic components.

BACKGROUND

With the development of electronic industry, electronic components operate at high frequency and speed, and the faster an electronic component operates, the more heat it generates. Excessive heat will result in the electronic component operating unstably, and even damaging the electronic component. So the heat must be removed quickly to keep the electronic component operating stably. Generally, heat dissipation devices are provided to the electronic component for dissipating heat.

Referring to FIG. 5, a conventional heat dissipation device comprises a heat sink 100. Which comprises a flat base 122 and a plurality of parallel fins 124 arranged on the base 122, and a fan 126 located above the fins 124 for providing airflow to the fins 124. The configuration of the heat dissipation device provides large heat-dissipating area. However, due to high density of the fins 124, large resistance to the airflow is inevitably generated, which results in the speed of airflow being decreased thereby decreasing the heat dissipating efficiency of the heat dissipation device. Provided lowering the density of the fins 124 to reduce the resistance, the heat-dissipating area can also decreases, accordingly, the heat dissipation efficiency decreases. Additionally, the airflow produced by the fan 126 flows spirally and downwardly, which is inconsistent with the extending direction of the parallel fins 124. Thus the airflow cannot contact adequately the fins 124. As a result, heat-exchanging efficiency between the airflow and the fins 124 is lowered.

Thus, an improved heat dissipation device which overcomes the aforesaid drawback is desired.

SUMMARY OF THE INVENTION

Accordingly, an object of the present invention is to provide a heat dissipation device which has a large heat dissipating area and low resistance.

Another object of the present invention is to provide a heat dissipation device of which the airflow is utilized adequately.

In order to achieve the objects set out above, a heat dissipation device according to the present invention comprises a heat sink and a fan providing airflow to the heat sink. The heat sink comprises a base and a heat dissipating part has a plurality of fins arranged on the base. Each adjacent pair of fins defines a channel therebetween through which airflow is forced to flow. A plurality of passages is defined crossing through the fins for reducing resistance of the fins to the airflow.

Other objects, advantages and novel features of the present invention will become more apparent from the following detailed description when taken in conjunction with the accompanying drawings.

DETAILED DESCRIPTION OF PREFERRED EMBODIMENTS

Figure 1:
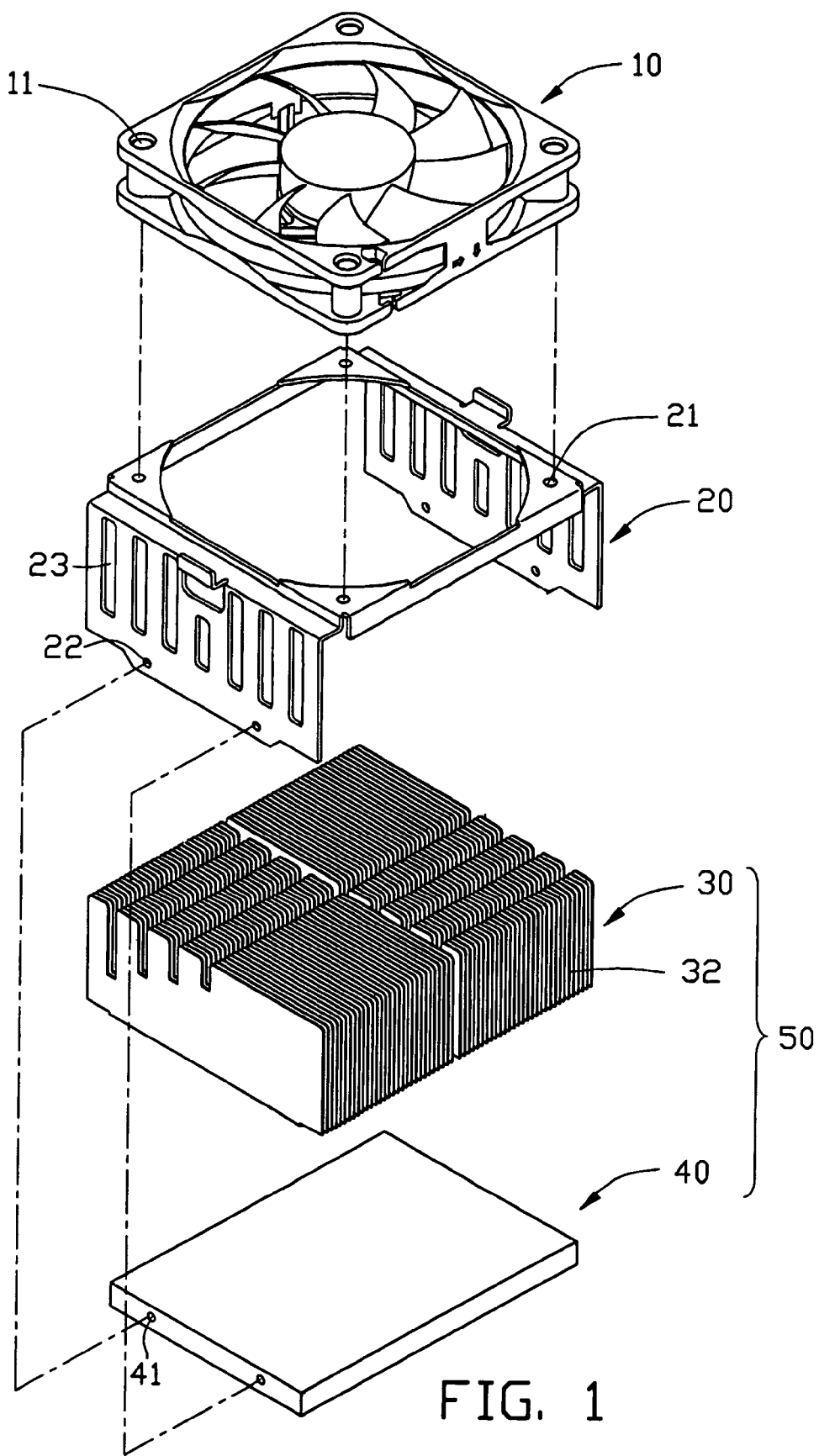
FIG. 1 is an exploded isometric view of a heat dissipation device according to a preferred embodiment of the present invention.

Reference will now be made to the drawing figures to describe the present invention in detail.

Figure 2:
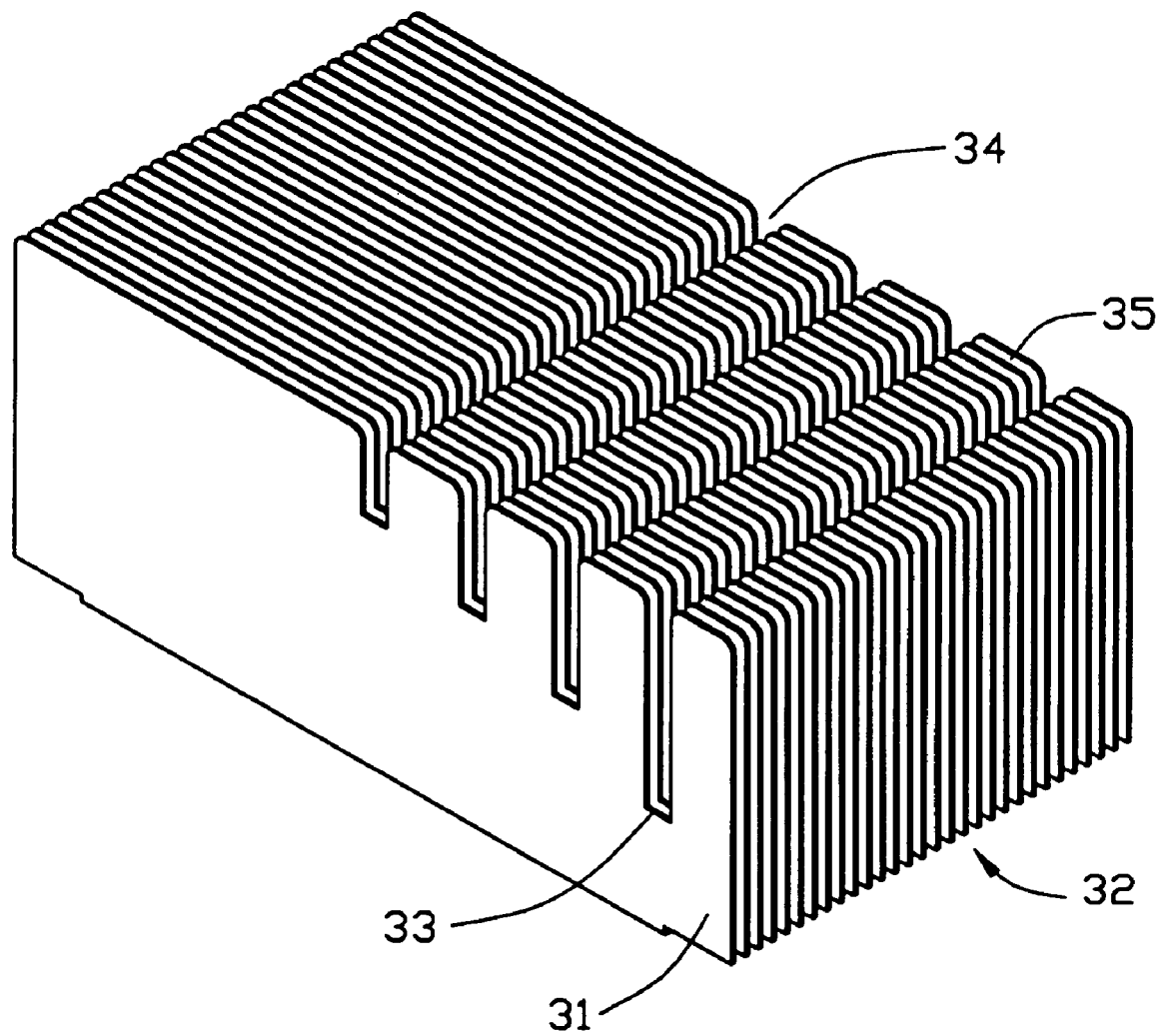
FIG. 2 is an isometric view of a fin unit of the heat dissipation device of FIG. 1.

Referring to FIGS. 1–2, a heat dissipation device in accordance with the preferred embodiment of the present invention comprises a heat sink 50 made of thermally conductive material, such as aluminum and copper and so on, a fan 10 for providing spiral airflow to the heat sink 50, and an inverted U-shaped bracket 20 for securing the fan 10 on the heat sink 50. The heat sink 50 comprises a base 40 for thermally contacting a heat-generating component (not shown) and a heat dissipating part 30 arranged on the base 40. A hole 11 is defined at each corner of the fan 10 and a bore 21 is defined at the bracket 20 corresponding to each hole 11. A screw (not shown) passes through each hole 11 to engage with the corresponding bore 21, thereby securing the fan 10 on a top of the bracket 20. Two orifices 22 are defined at each of two opposite sidewalls of the bracket 20 for screws passing through the orifices 22 and apertures 41 defined at the base 40 corresponding with the orifices 22 to secure the bracket 20 on the base 40 of the heat sink 50. A plurality of openings 23 is defined at each of the sidewalk of the bracket 20.

The heat dissipating part 30 welded or stuck on the base 40 comprises a couple of parallel fin units 32, each of which comprises a plurality of parallel fins 31. Each two adjacent fins 31 define a channel 35 therebetween. A plurality of gaps 33 is defined at a side of each fin 31, and the gaps 33 are deepened from the middle to the side of the each fin 31. The gaps 33 of the fins 31 cooperatively form a plurality of passages 34 perpendicular to the channels 35. Orienting the two fin units 32 makes the passages 34 disposed diagonally at the heat dissipating part 30, so that the channels 35 and the passages 34 are consistent with the spiral airflow blown to the fins 31 from the fan 10, and the passages 34 are aligned with the openings 23 of the bracket 20, thereby decreasing the resistance caused by the fins 31.

Figure 3:
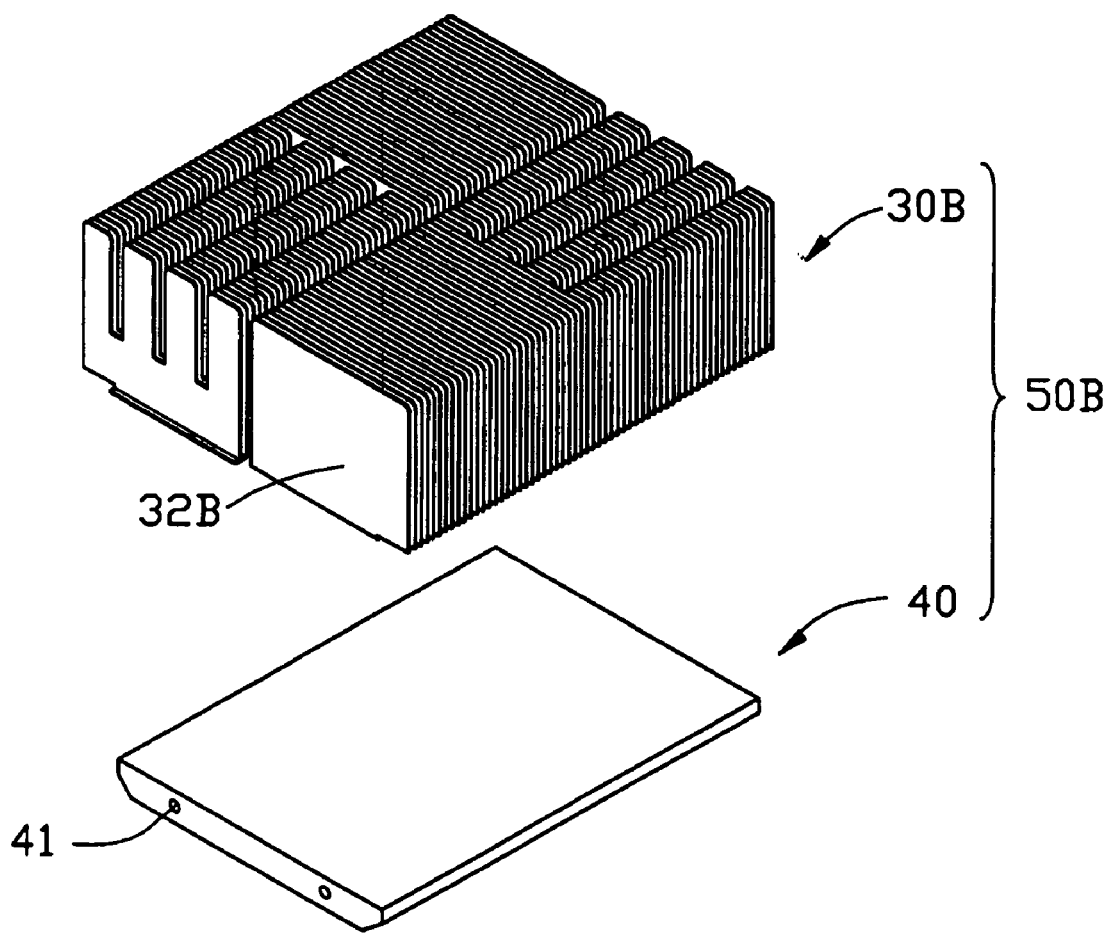
FIG. 3 is an exploded isometric view of a heat sink of a heat dissipation device according to an alternative embodiment of the present invention.
Figure 4:
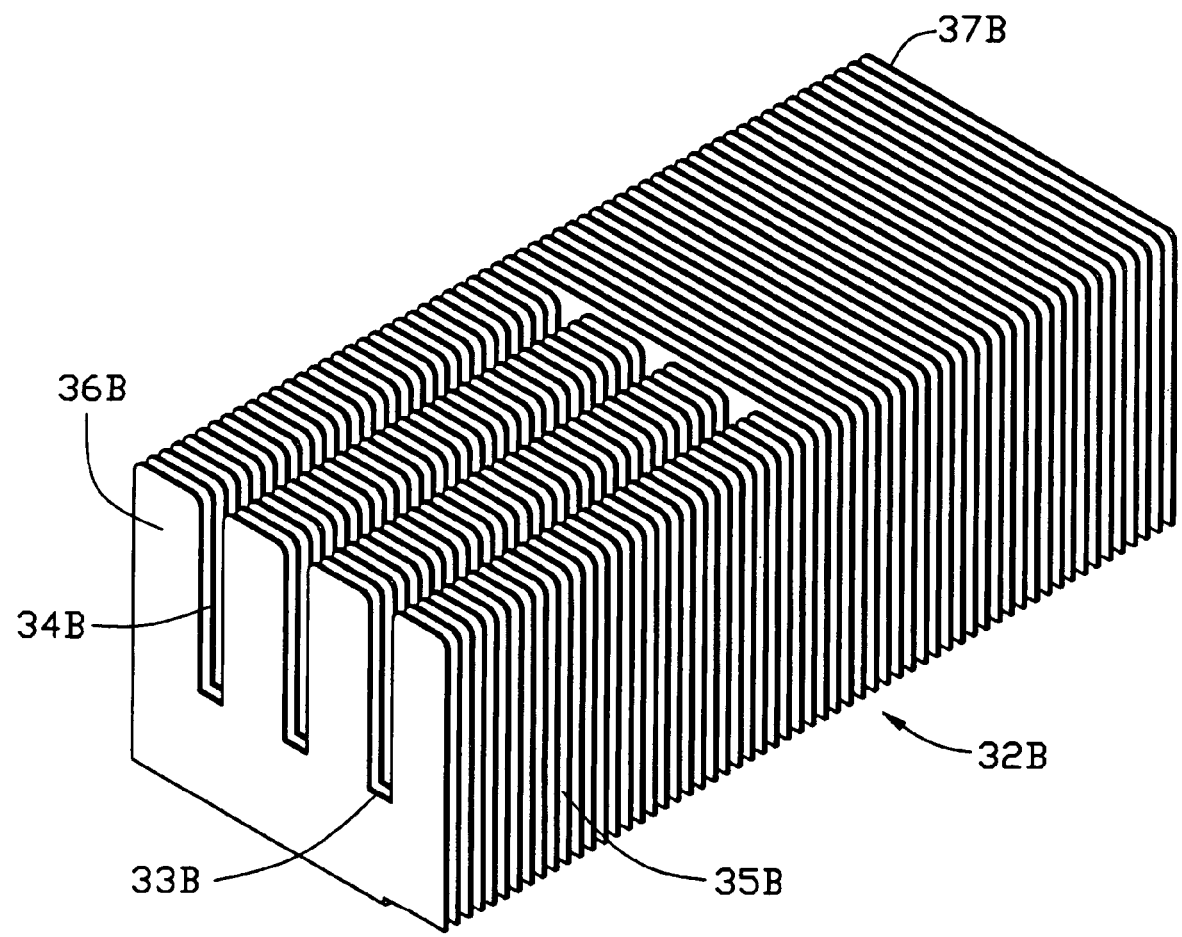
FIG. 4 is an isometric view of a fin unit of the heat dissipation device of FIG. 3.
Figure 5:
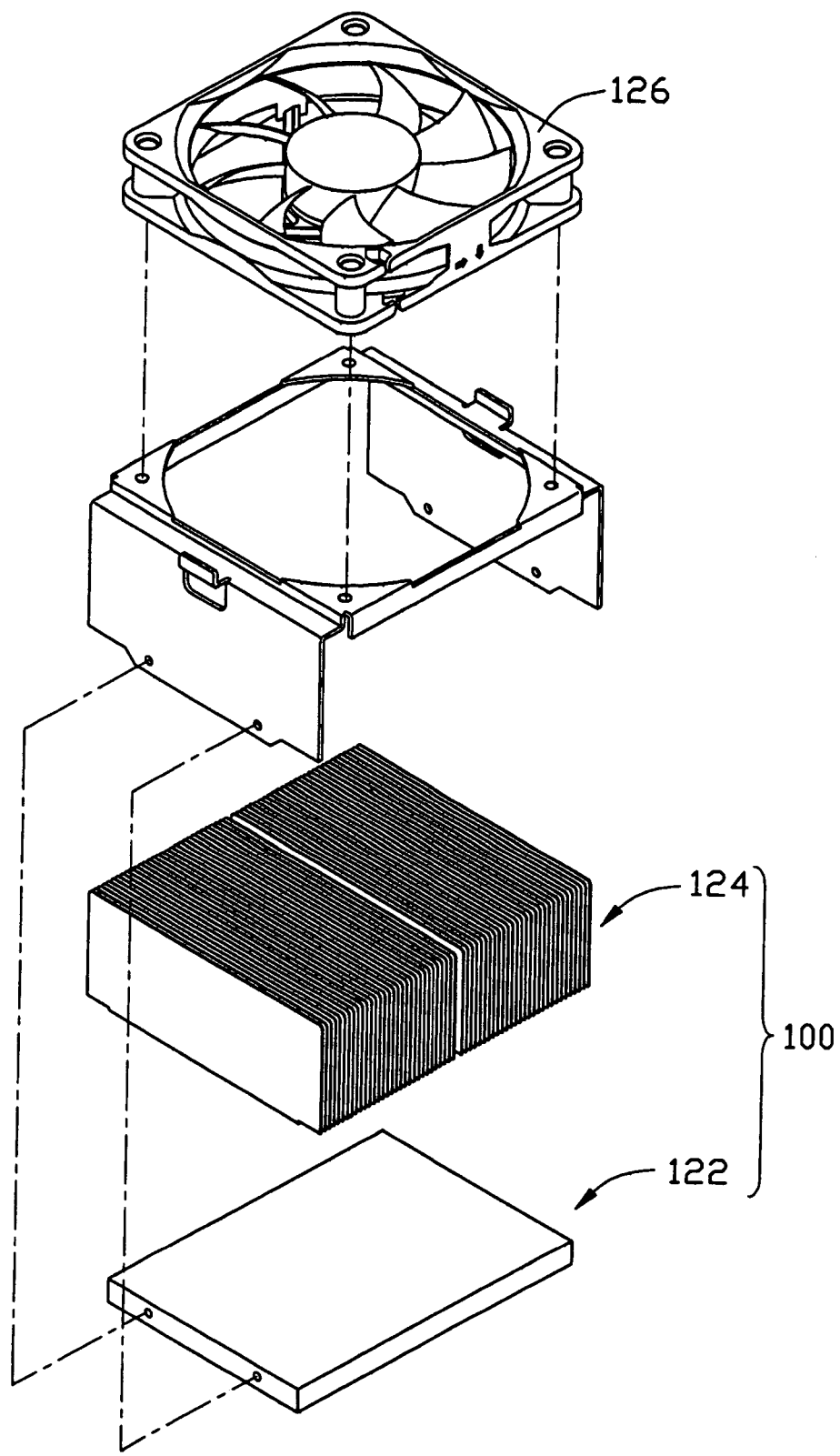
FIG. 5 is a sketch view of a conventional heat dissipation device.

FIGS. 3–4 show an alternative embodiment of the heat sink of the present invention. The heat sink 50B comprises a heat dissipating part 30B, which comprises a couple of fin units 32B. Each fin unit 32B comprises a plurality of parallel first fins 36B and a plurality of parallel second fins 37B disposed at one side of the first fins 36B. A plurality of channels 35B defined between adjacent fins 36B, 37B. A plurality of gaps 33B being uniform in depth is defined in the first fins 36B. The gaps 33B cooperatively forms a plurality of passages 34B perpendicular to the channels 35B. Orienting the two fin units 32B makes the passages 34B disposed diagonally at the heat dissipating part 30B.

In the above embodiments, the fins 31, 36B defines a plurality of gaps 33, 33B therein, which forms the plurality of passages 34, 34B perpendicular to the channels 35,35B defined between the adjacent fins 31, 36B. The fins 31, 36B are arranged according to certain modes to cause the passages 34, 34B and the channels 35, 35B oriented consistently with the direction of the airflow produced by the fan 10. Accordingly, the resistance to the airflow generated by the fins 31 decreases under a condition that the heat-dissipating area does not decrease, and the airflow is utilized adequately, thereby improving the efficiency of the heat dissipation device.

In the present invention, the depth of the gaps 33, 33B is not limited, it can be uniform or different. And the figure of the gaps 33,33B is not limited either it can be rectangular or trapeziform or cambered and so on.

Table 1 below shows temperature data obtained from laboratory tests of the conventional heat dissipation device and the heat dissipation device of the present invention, in that order. The tests were conducted with the environment temperature being Ta. Tc represents the temperature that the heat-generating component operates with the conventional heat dissipation device or the heat dissipation device of the present invention. The table shows that heat resistance θ of the heat dissipation device of the present invention was always lower than heat resistance θ of the conventional heat dissipation device under the substantially same condition. That is to say, the efficiency of the heat dissipation device of the present invention is higher than that of the conventional heat dissipation device.

TABLE 1

| Sample | | The conventional heat dissipation device | | | | The heat dissipation device of the present invention | | | |
|---|---|---|---|---|---|---|---|---|---|
| Fan | Voltage (volt) | 12 | 15 | 12 | 15 | 12 | 15 | 12 | 15 |
| | Speed (rad/s) | 25740 | 31320 | 25740 | 31140 | 25560 | 30420 | 25380 | 30960 |
| Source | Voltage (volt) | 71 | 71 | 71 | 71 | 71 | 71 | 71 | 71 |
| | Current (amp) | 1.45 | 1.45 | 1.45 | 1.45 | 1.45 | 1.45 | 1.45 | 1.45 |
| | Power (watt) | 103.0 | 103.0 | 103.0 | 103.0 | 103.0 | 103.0 | 103.0 | 103.0 |
| Ta (° C.) | | 37.9 | 37.9 | 37.8 | 37.8 | 37.9 | 37.8 | 37.8 | 37.8 |
| Tc (° C.) | | 77.9 | 74.8 | 77.8 | 74.9 | 75.1 | 72.5 | 75.1 | 72.6 |
| ΔT (° C.) | | 40.0 | 36.9 | 40.0 | 37.1 | 37.2 | 34.7 | 37.3 | 34.8 |
| θ (° C./watt) | | 0.389 | 0.358 | 0.389 | 0.360 | 0.361 | 0.337 | 0.362 | 0.338 |

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
a heat sink having a plurality of parallel fins disposed on the base, a channel defined between each two adjacent fins, a plurality of passages defined in top portions of the fins of the heat sink and angled to the channels;
an inverted U-shaped bracket mounted on the heat sink and having sidewalls defining a plurality of openings aligned with the passages; and
a fan located above the heat sink and mounted on a top of the bracket for providing airflow to the heat sink;
wherein the passages and the channels are oriented according to the direction of the airflow produced by the fan and said passages are disposed diagonally at the heat sink and generally perpendicular to the channels.

2. The heat dissipation device of claim 1, wherein said bracket is secured to the base of the heat sink by fasteners extending through the bracket and engaging in the base.

3. The heat dissipation device of claim 1, wherein at least part of the fins define a plurality of gaps therein, and the gaps cooperatively forms said passages.

4. The heat dissipation device of claim 3, wherein said gaps of each fin are uniform in depth.

5. The heat dissipation device of claim 3, wherein said gaps of each fin are different in dept.

6. The heat dissipation device of claim 5, wherein said gaps are deepened gradually from the middle to one side of the fin.

7. A heat dissipation device comprising:
a heat sink having a plurality of fins, a channel defined between each two adjacent fins, a plurality of passages defined in part of the fins;
an inverted U-shaned bracket mounted on the heat sink and having sidewalls defining a plurality of openings aligned with the passages; and
a fan located above the heat sink and mounted on a ton of the bracket for providing airflow to the heat sink;
wherein a height of each of the passages of each fin is smaller than a height of the corresponding fin, the passages are disposed diagonally at the heat sink and angled to the channels.

8. The heat dissipation device of claim 7, wherein said passages are generally perpendicular to the channels.

9. The heat dissipation device of claim 8, wherein each of the fins defines a plurality of gaps in one side thereof, and the gaps of the fins cooperatively form said passages.

10. The heat dissipation device of claim 9, wherein said gaps are deepened gradually from the middle to one side of the fin.

11. The heat dissipation device of claim 8, wherein the fins comprise a plurality of first fins and a plurality of second fins.

12. The heat dissipation device of claim 11, wherein each of the first fins defines a plurality of gaps cooperatively forming said passages.

13. The heat dissipation device of claim 12, wherein said gaps are uniform in depth.

14. A heat dissipation device comprising:
a base used to thermally contact with a heat generating component and receive heat therefrom;
a heat dissipating part having a plurality of fins and attached to said base for receiving said heat therefrom, a channel defined between every two adjacent fins of said heat dissipating part so as to allow airflow passing through said channel, said heat dissipating part defining at least two areas with portions of said plurality of fins located therein and defining a plurality of passages on top portions of said plurality of fins so as to communicate said channel with neighboring one, and each of said at least two areas exclusively neighboring areas of said heat dissipating part with portions of said plurality of fins defining no passage thereon;
an inverted U-shaped bracket mounted on the heat sink and having sidewalls defining a plurality of openings aligned with the passages; and
a fan located above the heat sink and mounted an a top of the bracket for providing airflow to the heat sink.

15. The heat dissipation device of claim 14, wherein said plurality of passages defined on one portion of said plurality of fins is aligned with said plurality of passages defined on another portion of said plurality of fins.

16. The heat dissipation device of claim 14, wherein said at least two areas of said heat dissipating part are arranged diagonally with respect to said base.

17. The heat dissipation device of claim 14, wherein the bracket is secured to the base by fasteners extending through the bracket and engaging in the base.

* * * * *